(12) United States Patent
Otake

(10) Patent No.: US 8,482,320 B2
(45) Date of Patent: Jul. 9, 2013

(54) CURRENT DETECTION CIRCUIT AND SEMICONDUCTOR INTEGRATED CIRCUIT

(75) Inventor: Seiji Otake, Kumagaya (JP)

(73) Assignee: ON Semiconductor Trading, Ltd., Hamilton (BM)

( * ) Notice: Subject to any disclaimer, the term of this patent is extended or adjusted under 35 U.S.C. 154(b) by 158 days.

(21) Appl. No.: 13/032,357

(22) Filed: Feb. 22, 2011

(65) Prior Publication Data

US 2011/0204952 A1    Aug. 25, 2011

(30) Foreign Application Priority Data

Feb. 23, 2010 (JP) ................................. 2010-036878

(51) Int. Cl.
*H03K 3/00*    (2006.01)

(52) U.S. Cl.
USPC ............................ 327/108; 327/112; 361/91.2

(58) Field of Classification Search
USPC ................... 327/108, 112; 361/91.2
See application file for complete search history.

(56) References Cited

U.S. PATENT DOCUMENTS

| 4,390,833 | A | * | 6/1983 | Tzeng | 323/280 |
| 5,621,601 | A | * | 4/1997 | Fujihira et al. | 361/93.9 |
| 5,650,737 | A | * | 7/1997 | Eilley | 327/108 |
| 5,754,074 | A | * | 5/1998 | Kelly | 327/434 |
| 7,489,489 | B2 | * | 2/2009 | Kim | 361/93.1 |
| 7,602,161 | B2 | * | 10/2009 | McLeod | 323/273 |
| 7,839,616 | B2 | * | 11/2010 | Kirn | 361/93.1 |

FOREIGN PATENT DOCUMENTS

JP    6-58981    3/1994

* cited by examiner

*Primary Examiner* — Kenneth B. Wells
(74) *Attorney, Agent, or Firm* — Morrison & Foerster LLP

(57) ABSTRACT

The invention provides a current detection circuit for a transistor, that does not influence a current flowing through the transistor, and minimizes a power loss, an increase of the pattern area and so on. A current detection circuit includes a wiring connected to a MOS transistor and forming a current path of a current of the MOS transistor, a current detection MOS transistor of which the gate is connected to the wiring, that flows a current corresponding to the potential of the gate, and a current detector detecting a current flowing through the current detection MOS transistor. The current detection circuit is configured including a load resistor connected to the current detection MOS transistor and a voltage detection circuit detecting a drain voltage of the current detection MOS transistor.

5 Claims, 3 Drawing Sheets

CURRENT DETECTION CIRCUIT AND SEMICONDUCTOR INTEGRATED CIRCUIT

CROSS-REFERENCE OF THE INVENTION

This application claims priority from Japanese Patent Application No. 2010-036878, the content of which is incorporated herein by reference in its entirety.

BACKGROUND OF THE INVENTION

1. Field of the Invention

The invention relates to a current detection circuit detecting a current flowing through a transistor and a semiconductor integrated circuit.

2. Description of the Related Art

Conventionally, a current detection circuit is sometimes built in a semiconductor integrated circuit so as to detect a current flowing through a transistor formed therein.

FIG. 6 is a circuit diagram of a current detection circuit of a MOS transistor 50. As shown in the figure, this current detection circuit is so configured that one end of a resistor 51 is connected to the source S of the MOS transistor 50, the other end of the resistor 51 is grounded, and both the ends of the resistor 51 are connected to a voltmeter 52.

In the current detection, in the state where the MOS transistor 50 is turned on by applying a gate potential at a threshold or more to the gate G of the MOS transistor 50, a drain voltage is applied to the drain D to flow a current I through the MOS transistor 50. In this case, when the resistance value of the voltmeter 52 is higher enough than the resistance value R of the resistor 51, the current I flowing through the MOS transistor 50 and the resistor 51 is almost constant. Therefore, a voltage V occurring at both the ends of the resistor 51 is measured by the voltmeter 52 to detect the current I flowing through the MOS transistor 50 by the Ohm's law (I=V/R). A relevant technique is disclosed in the Japanese Patent Application Publication No. Hei 6-58981.

However, since the potential of the source S of the MOS transistor 50 increases from the ground potential by the voltage V due to the current I flowing through the resistor 51, the current I of the MOS transistor 50 decreases. In other words, there occurs a problem that the resistor 51 of the current detection circuit influences the current flowing through the MOS transistor 50.

Furthermore, since the current I flows through the resistor 51, a power loss (W=I²R) by Joule heat occurs. In this case, when the resistor 51 of which the resistance value R is low is formed in the semiconductor integrated circuit so as to minimize the power loss, a large pattern area is needed. In particular, in the case of a power MOS transistor, the current I is significantly high and thus the problem described above is serious.

SUMMARY OF THE INVENTION

The invention provides a current detection circuit detecting a current flowing through a transistor. The circuit includes a wiring connected to the transistor so that the current for the detection flows through the wiring, a current detection MOS transistor having a gate connected to the wiring and allowing another current to flow through the detection MOS transistor in response to a potential of the gate applied by the wiring, and a current detector detecting the another current.

The invention also provides a semiconductor integrated circuit that includes a transistor allowing a current to flow through the transistor, a wiring connected to the transistor so that the current flows through the wiring, a current detection MOS transistor having a gate connected to the wiring and allowing another current to flow through the detection MOS transistor in response to a potential of the gate applied by the wiring, a current detector detecting the another current, and a control circuit controlling the current flowing through the transistor based on a detection output of the current detector.

DETAILED DESCRIPTION OF THE INVENTION

Figure 1:
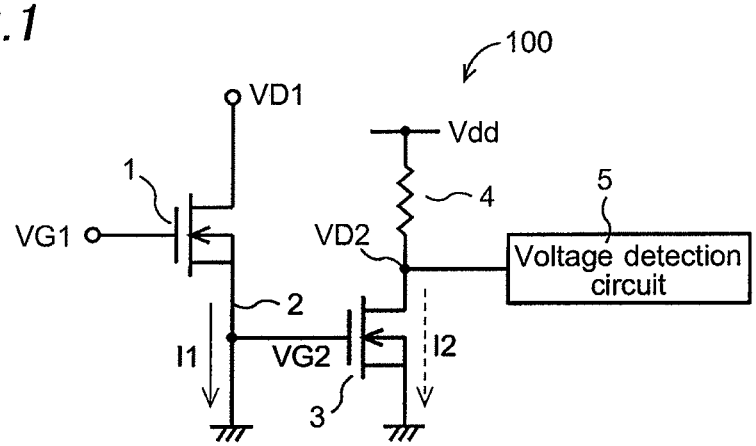
FIG. 1 is a circuit diagram of a current detection circuit of a first embodiment of the invention.
Figure 2:
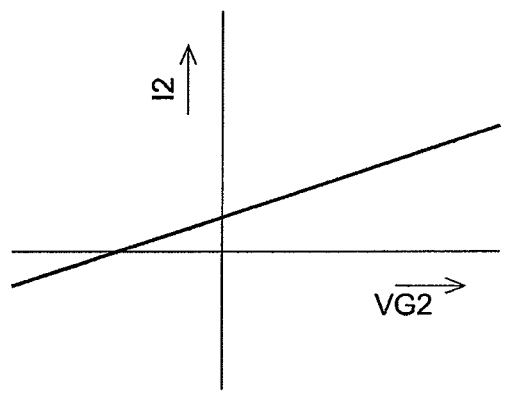
FIG. 2 is a diagram of a drain current—gate potential characteristic of a current detection MOS transistor of FIG. 1.

A current detection circuit 100 of a first embodiment of the invention will be described referring to figures. FIG. 1 is a circuit diagram showing a current detection circuit 100. FIG. 2 is a diagram of a current I2—gate potential VG2 characteristic of a current detection MOS transistor 3 of FIG. 1.

The current detection circuit 100 is a circuit that detects a current I1 flowing through an N channel type MOS transistor 1, and includes a wiring 2, the current detection MOS transistor 3, a load resistor 4 and a voltage detection circuit 5.

The N channel type MOS transistor 1 is grounded through the wiring 2, and the gate of the current detection MOS transistor 3 is connected to the longitudinal middle of the wiring 2. The current detection MOS transistor 3 is an N channel type depletion MOS transistor. The drain of the current detection MOS transistor 3 is connected to one end of the load resistor 4, and a power potential Vdd is applied to the other end of the load resistor 4. The source of the current detection MOS transistor 3 is grounded.

The voltage detection circuit 5 is a circuit that detects the drain potential VD2 of the current detection MOS transistor 3. In this case, the load resistor 4 and the voltage detection circuit 5 form a current detector that detects a current I2 flowing through the current detection MOS transistor 3.

The operation of this current detection circuit 100 will be described hereafter. By setting the gate potential VG1 of the MOS transistor 1 at the threshold or more and applying a positive drain potential VD1, the MOS transistor 1 turns on and a current I1 flows.

When the current I1 flows through the MOS transistor 1, the gate potential VG2 of the current detection MOS transistor 3 increases from the ground potential corresponding to the current value of the current I1. This is because that the current I1 flows through the wiring 2 and a voltage decrease occurs due to the resistor component of the wiring 2.

When the gate potential VG2 is determined corresponding to the current I1, a current I2 flows through the current detection MOS transistor 3 corresponding to the gate potential VG2. Then the drain potential VD2 of the current detection MOS transistor 3 is determined corresponding to the current I2. In this case, the drain potential VD2 is expressed by VD2=Vdd−I2×R1. R1 is the resistance value of the load resistor 4.

In other words, when the current I2 of the current detection MOS transistor 3 increases, the drain potential VD2 decreases. Therefore, by detecting the drain potential VD2 of the current detection MOS transistor 3 by the voltage detection circuit 5, the value of the current I1 is obtained by the correlation between the gate potential VG2 and the current I1.

In this case, since the current detection MOS transistor 3 is of a depletion type, even when the current I1 flowing through the MOS transistor 1 is zero, in other words, even when the gate potential VG2 of the current detection MOS transistor 3 is at the ground potential (=0 V), a minute current I2 flows. When the current I1 flowing through the MOS transistor 1 then increases from zero, the gate potential VG2 of the current detection MOS transistor 3 increases from the ground potential and the current I2 increases accordingly (see FIG. 2).

Therefore, the current detection circuit 100 achieves detecting the current I1 flowing through the MOS transistor 1 in a wide range of zero to a large value.

Furthermore, since the current detection sensitivity of the current detection MOS transistor 3 is high, the resistor component of the wiring 2 may be very small. The wiring 2 is made of metal such as aluminum, for example. Therefore, the source potential of the MOS transistor 1 changes only slightly from the ground potential even when the current I1 flows, and thus the current I1 flowing through the MOS transistor 1 is not influenced by the resistor component of the wiring 2. Furthermore, since the resistor component of the wiring 2 is small, a power loss is also minimized. Furthermore, the pattern area of the wiring 2 and the current detection MOS transistor 3 are small.

It is noted that the voltage detection circuit 5 may be made of a comparator that compares the drain potential VD2 with a reference potential. At this time, by setting the reference potential corresponding to the reference value of the current I1 flowing through the MOS transistor 1, it is detected based on an output of this comparator whether or not the current I1 flowing through the MOS transistor 1 is at the reference value or more.

Figure 3:
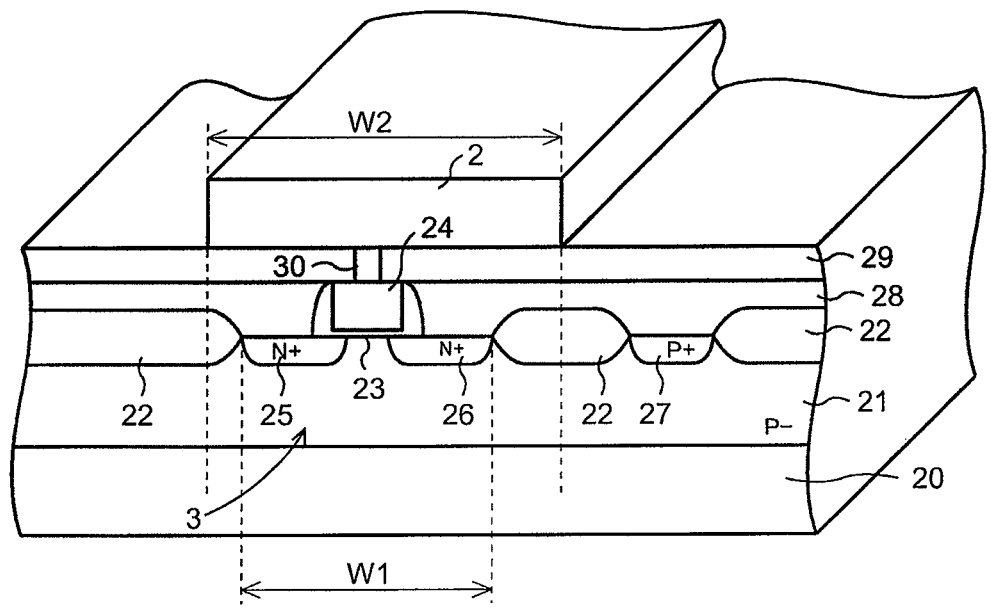
FIG. 3 is a perspective view showing a cross-sectional structure of the current detection circuit of the first embodiment of the invention.

The cross-sectional structure of the current detection circuit 100 will be described referring to FIG. 3. FIG. 3 shows a portion around the wiring 2 of the MOS transistor 1 and the current detection MOS transistor 3. As shown in the figure, a P-type semiconductor layer 21 is formed on the front surface of a semiconductor substrate 20, and the current detection MOS transistor 3 is formed in a region surrounded by an element isolation film 22 on the front surface of the semiconductor layer 21.

The current detection MOS transistor 3 includes a gate electrode 24 formed on the semiconductor layer 21 with a gate insulation film 23 being interposed therebetween, an N+ type source 25 and an N+ type drain 26. Furthermore, since the current detection MOS transistor 3 is an N channel type depletion MOS transistor, a low concentration N type layer or depletion layer (not shown) exists in the front surface (a channel region) of the semiconductor layer 21 between the source 25 and the drain 26, and a minute current flows between the source 25 and the drain 26 through this N type layer or the like.

A P+ type contact layer 27 is formed on the semiconductor layer 21 in a region apart from the current detection MOS transistor 3 over the element isolation film 22. The P+ type contact layer 27 is electrically connected to the source 25 in a region that is not shown. By this, the potential of the semiconductor layer 21 as the back gate of the MOS transistor 1 is fixed at the source potential.

The current detection MOS transistor 3 is covered by a passivation film 28 such as a silicon oxide film and an interlayer insulation film 29 such as a BPSG film, and the wiring 2 is extended on the interlayer insulation film 29 above the current detection MOS transistor 3. The wiring 2 is made of metal including aluminum or metal including copper, for example. This wiring 2 is a current path of the current I1 flowing from the source of the MOS transistor 1, and connected to the gate electrode 24 of the current detection MOS transistor 3 through a contact 30 provided in the interlayer insulation film 29.

In detail, the current detection MOS transistor 3 is foamed under the wiring 2 in the thickness direction of the semiconductor substrate 20, and the width W1 is smaller than the width W2 of the wiring 2 in the planar direction of the semiconductor substrate 20. This achieves minimizing the pattern area of the entire region where the current detection circuit is formed.

Furthermore, in the case where the current detection MOS transistor 3 is formed by a semiconductor process, although a low concentration N type layer or depletion layer need be formed in the channel region, a heat treatment process of the semiconductor process may decrease the surface concentration of the semiconductor layer 21 to form the N type layer or depletion layer naturally. In such a semiconductor process, it is not necessary to perform a particular ion implantation process for forming the N type layer or depletion layer. In this case, although ion implantation for threshold adjustment is performed for an enhancement type MOS transistor (e.g. the MOS transistor 1) forming an ordinary circuit, the current detection MOS transistor 3 is covered by a resist mask so as to avoid being subjected to the ion implantation for the threshold adjustment.

Figure 4:
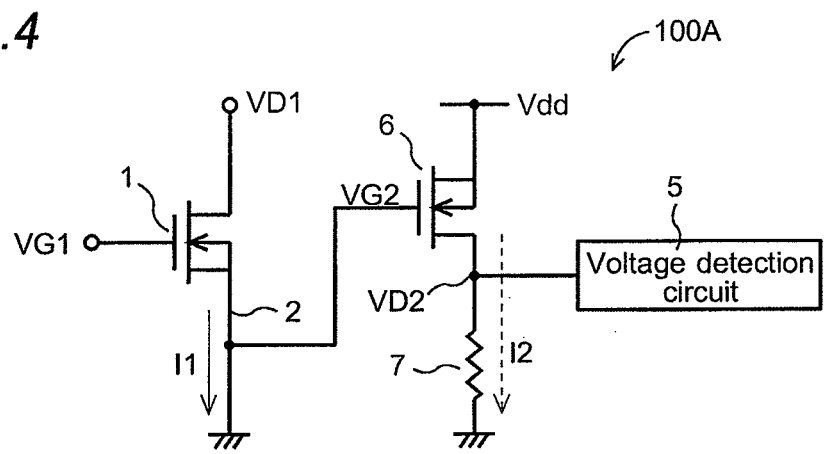
FIG. 4 is a circuit diagram showing a current detection circuit of a second embodiment of the invention.

A current detection circuit of a second embodiment of the invention will be described referring to a figure. FIG. 4 is a circuit diagram showing this current detection circuit 100A. In the embodiment, a current detection MOS transistor 6 made of a P channel type enhancement MOS transistor is used instead of the current detection MOS transistor 3 of the first embodiment.

The source of the current detection MOS transistor 6 is connected to the power potential Vdd, and the drain thereof is grounded through a load resistor 7. The voltage detection circuit 5 detects the drain potential VD2 of the current detection MOS transistor 6. The other structure is the same as that of the first embodiment.

In this case, when the absolute value of the threshold voltage of the current detection MOS transistor 6 is defined as Vtp, the current detection MOS transistor 6 turns on by satisfying a relation of Vdd−VG2>Vtp. Since the gate potential VG2 is approximate to the ground potential, this relation is satisfied by setting Vdd at about 3 V and Vtp at about 1 V, for example.

In other words, even when the current I1 flowing through the MOS transistor 1 is zero, i.e., even when the gate potential VG2 of the current detection MOS transistor 6 is at the ground potential (=0 V), a current I2 flows through the current detection MOS transistor 6.

When the current I1 flowing through the MOS transistor 1 then increases from zero, the gate potential VG2 of the current detection MOS transistor 6 increases from the ground potential and the current I2 decreases accordingly. In this case, the drain potential VD2 of the current detection MOS transistor 6 is represented by VD2=I2×R2. R2 is the resistance value of the load resistor 7.

Therefore, by detecting the drain potential VD2 of the current detection MOS transistor 6 by the voltage detection circuit 5, the value of the current I1 of the MOS transistor 1 is obtained from the correlation between the VD2 and the current I1.

In this manner, the current detection circuit 100A achieves detecting the current I1 flowing through the MOS transistor 1 in a wide range from zero to a large value, like in the first embodiment.

Figure 5:
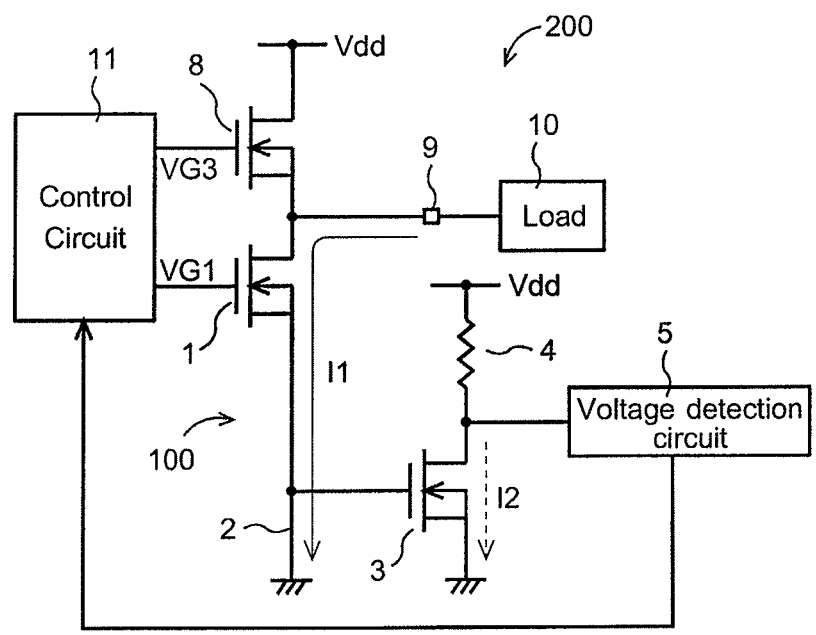
FIG. 5 is a circuit diagram showing a current detection circuit of a third embodiment of the invention.
Figure 6:
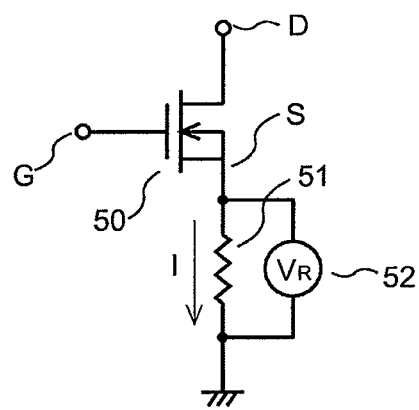
FIG. 6 is a circuit diagram of a conventional current detection circuit.

A semiconductor integrated circuit 200 of a third embodiment of the invention will be described referring to FIG. 5. FIG. 5 is a circuit diagram showing the semiconductor integrated circuit 200. The semiconductor integrated circuit 200 is a circuit using the current detection circuit 100 of the first embodiment, and configured including the current detection circuit 100, N channel type MOS transistors 1, 8, a terminal 9, and a control circuit 11.

The MOS transistors 1, 8 are connected in series and form an output circuit. The outputs of the MOS transistors 1, 8 are supplied to an external load 10 (e.g. a current load such as an LED) through the terminal 9. The control circuit 11 controls the switching of the MOS transistors 1, 8 by supplying gate potentials VG1, VG3 as control voltages to the gates of the MOS transistors 1, 8, respectively. The MOS transistors 1, 8 are switched complementarily, and when the MOS transistor 1 turns on, a current I1 flows through the MOS transistor 1 from the load 10.

In this case, a detection output of the voltage detection circuit 5 is fed back to the control circuit 11, and the control circuit 11 controls the gate potential VG1 based on the detection output of the voltage detection circuit 5. This realizes the feed-back control of the current I1 of the MOS transistor 1.

For example, when the current value of the current I1 when the MOS transistor 1 turns on is to be controlled at a target value, the control circuit 11 controls the gate potential VG1 so that the current value of the current I1 is at the target value, based on a detection output of the voltage detection circuit 5. In detail, when the current I1 flowing through the MOS transistor 1 is lower than the target value, the control circuit 11 increases the gate potential VG1. By this, the current I1 flowing through the MOS transistor 1 increases. When the current I1 flowing through the MOS transistor 1 is higher than the target value, the control circuit 11 decreases the gate potential VG1. By this, the current I1 flowing through the MOS transistor 1 decreases.

Furthermore, when the current value of the current I1 when the MOS transistor 1 turns on is to be controlled at a threshold or less, the control circuit 11 decreases the gate potential VG1 when the current I1 flowing through the MOS transistor 1 is at the threshold or more, based on a detection output of the voltage detection circuit 5. By this, the current I1 flowing through the transistor 1 decreases to the threshold or less.

In the semiconductor integrated circuit 200, the current detection circuit 100A of the second embodiment may be used instead of the current detection circuit 100 of the first embodiment.

The invention is not limited to the embodiments described above, and modifications are possible within the scope of the invention. For example, although the MOS transistor 1 of the embodiments described above is an N channel type MOS transistor, the invention is not limited to this and other transistor, for example, a P channel type MOS transistor or a bipolar transistor may be used instead.

A current detection circuit of the invention detects a current flowing through a current detection MOS transistor corresponding to a current flowing through a transistor. Therefore, the current flowing through the transistor is not influenced, and a power loss, an increase of the pattern area and so on are minimized. In particular, the invention has a large effect when it is applied to a transistor of high current output.

Furthermore, a semiconductor integrated circuit of the invention achieves controlling a current flowing through a transistor in addition to the effect described above.

What is claimed is:

1. A current detection circuit detecting a current flowing through a transistor, comprising:
   a wiring connected to the transistor so that the current for the detection flows through the wiring;
   a current detection MOS transistor comprising a gate connected to the wiring and allowing another current to flow through the detection MOS transistor in response to a potential of the gate applied by the wiring; and
   a current detector detecting the another current,
   wherein the entire current detection MOS transistor is covered by the wiring so that, in a sectional view of the current detection MOS transistor, edges of the wiring are located away from an active region of the current detection MOS transistor so as to be at an element isolation film surrounding the active region.

2. The current detection circuit of claim 1, wherein the current detection MOS transistor is a depletion type MOS transistor.

3. The current detection circuit of claim 1, wherein the current detection MOS transistor is an enhancement type MOS transistor.

4. The current detection circuit of claim 1, wherein the current detector comprises a load resistor connected to a drain of the current detection MOS transistor and a voltage detection circuit detecting a potential of the drain.

5. A semiconductor integrated circuit comprising:
   a transistor comprising a drain connected to a power potential and a source directly connected to a reference potential;
   a wiring connecting the source of the transistor to the reference potential;
   a current detection MOS transistor comprising a gate connected to the wiring, a source and a drain; and
   a current detector connected to the drain of the current detection MOS transistor.

* * * * *